(12) United States Patent
Hsiao

(10) Patent No.: US 8,113,478 B2
(45) Date of Patent: Feb. 14, 2012

(54) STACK BOARD AND SERVER ASSEMBLY USING SAME

(75) Inventor: Yi-Liang Hsiao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 39 days.

(21) Appl. No.: 12/824,506

(22) Filed: Jun. 28, 2010

(65) Prior Publication Data

US 2011/0284711 A1    Nov. 24, 2011

(30) Foreign Application Priority Data

May 18, 2010    (TW) ................................ 99115748 A

(51) Int. Cl.
*A47B 91/00*    (2006.01)

(52) U.S. Cl. ......... 248/346.03; 248/221.11; 248/220.22; 361/727; 361/679.58; 312/323; 312/223.2

(58) Field of Classification Search ............. 248/346.03, 248/221.11, 220.22; 361/727, 679.33, 679.58, 361/726; 312/223.1, 223.2, 322, 323; 224/282
See application file for complete search history.

(56) References Cited

U.S. PATENT DOCUMENTS

| | | | | | |
|---|---|---|---|---|---|
| 776,736 | A | * | 12/1904 | Greenen | 312/323 |
| 1,380,518 | A | * | 6/1921 | Bellig | 403/219 |
| 2,565,845 | A | * | 8/1951 | Frederick | 312/246 |
| 2,734,708 | A | * | 2/1956 | Cohn | 248/517 |
| 2,793,387 | A | * | 5/1957 | Odell | 16/358 |
| 4,314,734 | A | * | 2/1982 | Grunert | 312/322 |
| 4,368,866 | A | * | 1/1983 | Urban | 248/286.1 |
| 4,441,771 | A | * | 4/1984 | Roesler | 312/322 |
| 4,487,461 | A | * | 12/1984 | Tindall et al. | 312/323 |
| 4,596,416 | A | * | 6/1986 | Muller | 296/37.12 |
| 5,169,221 | A | * | 12/1992 | Wheeler | 312/323 |
| 5,191,983 | A | * | 3/1993 | Hardy | 211/40 |
| 5,213,401 | A | * | 5/1993 | Hatcher | 312/208.1 |
| 5,302,015 | A | * | 4/1994 | Du Vall | 312/282 |
| 5,306,077 | A | * | 4/1994 | Trevaskis | 312/122 |
| 5,392,915 | A | * | 2/1995 | Kalin | 206/503 |
| 5,599,079 | A | * | 2/1997 | Ranno et al. | 312/323 |
| 6,846,052 | B2 | * | 1/2005 | Kelley et al. | 312/208.1 |
| 7,090,316 | B2 | * | 8/2006 | Model | 312/323 |
| 7,140,703 | B1 | * | 11/2006 | Holdgate et al. | 312/323 |
| 7,165,798 | B2 | * | 1/2007 | Chamberlain et al. | 296/37.1 |
| 7,363,640 | B2 | * | 4/2008 | Wang et al. | 720/657 |
| 7,525,795 | B2 | * | 4/2009 | Cheng | 361/679.33 |
| 7,536,752 | B2 | * | 5/2009 | Laursen | 16/358 |
| 7,661,777 | B2 | * | 2/2010 | Ceccarelli et al. | 312/323 |
| 7,697,279 | B2 | * | 4/2010 | Yeh et al. | 361/679.39 |
| 2004/0174105 | A1 | * | 9/2004 | Hung | 312/351.1 |

* cited by examiner

*Primary Examiner* — Terrell McKinnon
*Assistant Examiner* — Daniel J Breslin
(74) *Attorney, Agent, or Firm* — Altis Law Group, Inc.

(57) ABSTRACT

An exemplary stack board includes a base, a supporting platform and pivots connected between the base and the supporting platform. The base defines four guide channels therein. Each guide channel includes an oblique guide groove. The supporting platform is mounted on the base and capable of supporting a server system thereon. The pivots are received in the guide channels, respectively, and moveable along the oblique guide grooves such that the supporting platform is movable relative to the base from a first position substantially coinciding with the base to a second position protruding from one side of the base, with the supporting platform tiltable to an oblique orientation at the second position.

12 Claims, 9 Drawing Sheets

STACK BOARD AND SERVER ASSEMBLY USING SAME

BACKGROUND

1. Technical Field

The present disclosure relates to a stack board, and a server assembly comprising a server system fixed on the stack board for shipping.

2. Description of Related Art

Server systems often include multiple standard servers mounted in a standard server cabinet. Each server is a standalone computer that can include many electronic components, such as one or more processors, random access memory (RAM), fixed disks, AC to DC (alternating current to direct current) power supplies, and others. For unified management, the servers are arranged in the server cabinet one-by-one in order; for example, from bottom to top.

During shipment of the server system, the server system is mounted on a stack board via a plurality of fixing structures. The stack board may resemble a pallet, and includes a base and a supporting plate on the base. The server system is supported on the supporting plate. After the server system reaches a shipment destination, a guiding ramp is positioned at an angle between one side of the supporting plate and the ground. The server system can then be rolled or slid along the guiding ramp from the supporting plate to the ground. However, each server system shipped requires such a guiding ramp, and the ramp, usually metal, is discarded after a single use. These arrangements for shipping the server system are costly, and waste materials.

It is thus desirable to provide a means which can overcome the described limitations.

DETAILED DESCRIPTION

Figure 1:
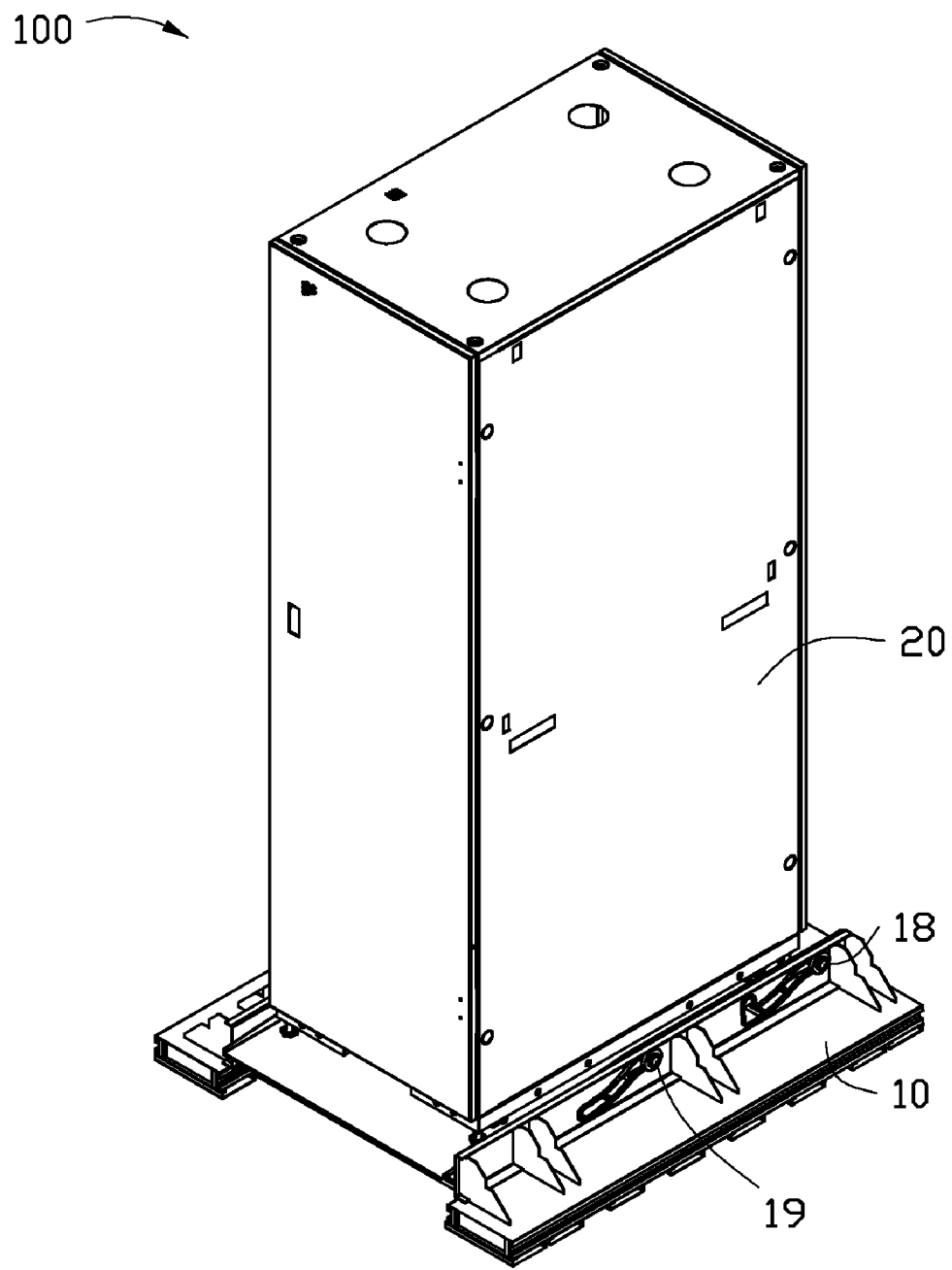
FIG. 1 is an isometric, assembled view of a server assembly in accordance with an exemplary embodiment of the present disclosure, the server assembly comprising a stack board and a server system mounted on the stack board.

Reference will now be made to the drawing figures to describe the present stack board and server assembly using the stack board in detail.

Referring to FIG. 1, a server assembly 100 according to an exemplary embodiment of the present disclosure is shown. The server assembly 100 includes a stack board 10 and a server system 20. The server system 20 has a plurality of servers (not shown) accommodated in a server cabinet 21 thereof. The server system 20 is mounted on the stack board 10 for shipping.

Figure 2:
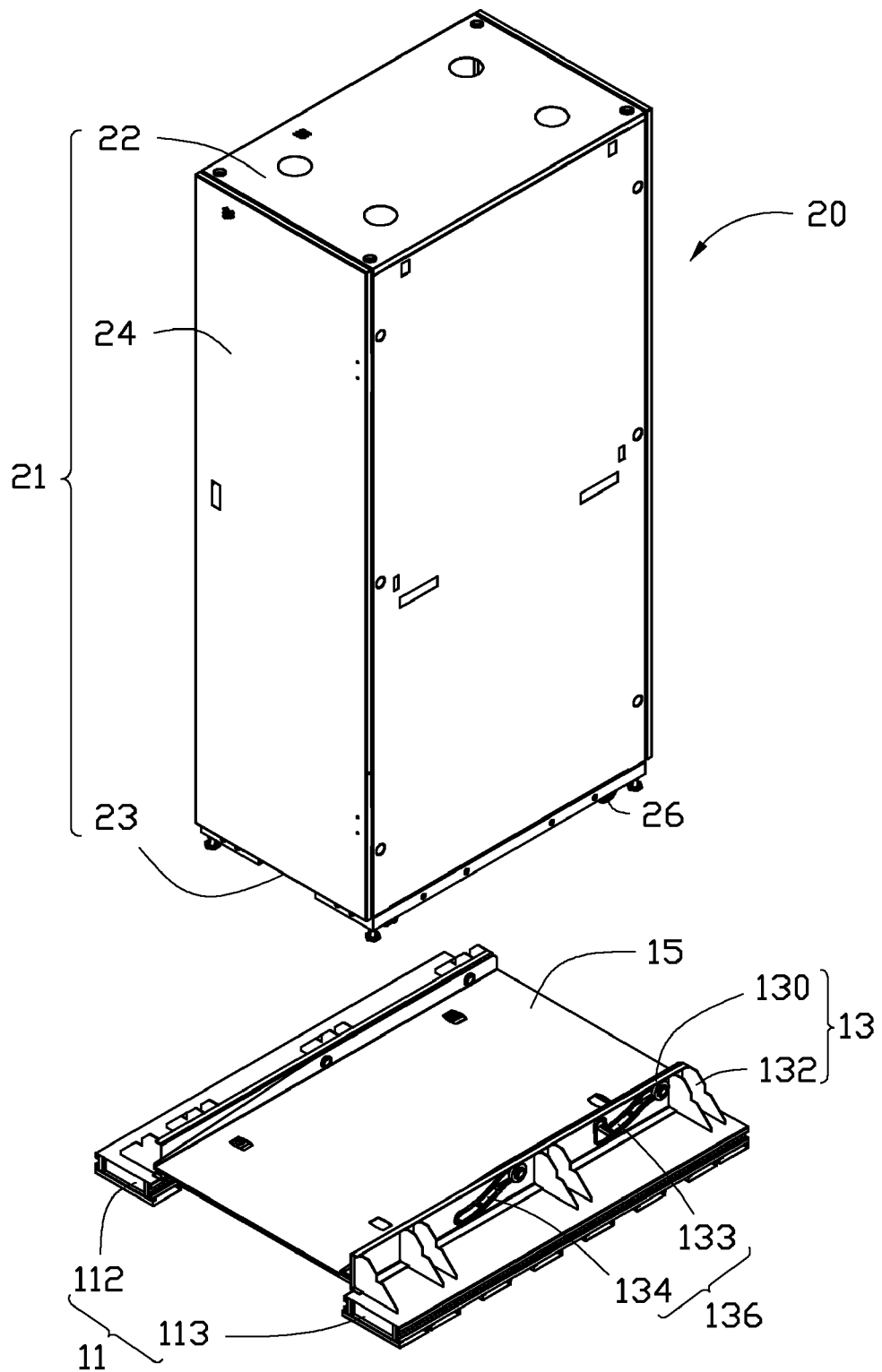
FIG. 2 is an exploded view of the server assembly of FIG. 1.

Referring also to FIG. 2, the server cabinet 21 is a hollow cuboid container, comprising a rectangular top surface 22, and a bottom surface 23 parallel and connected to the top surface 22 by a plurality of sidewalls 24. The top and bottom surfaces 22, 23 and the sidewalls 24 cooperatively define a cuboid receiving space (not shown) receiving the servers therein. Four wheels 26 are provided on the base, and can, for example, be casters.

Figure 3:
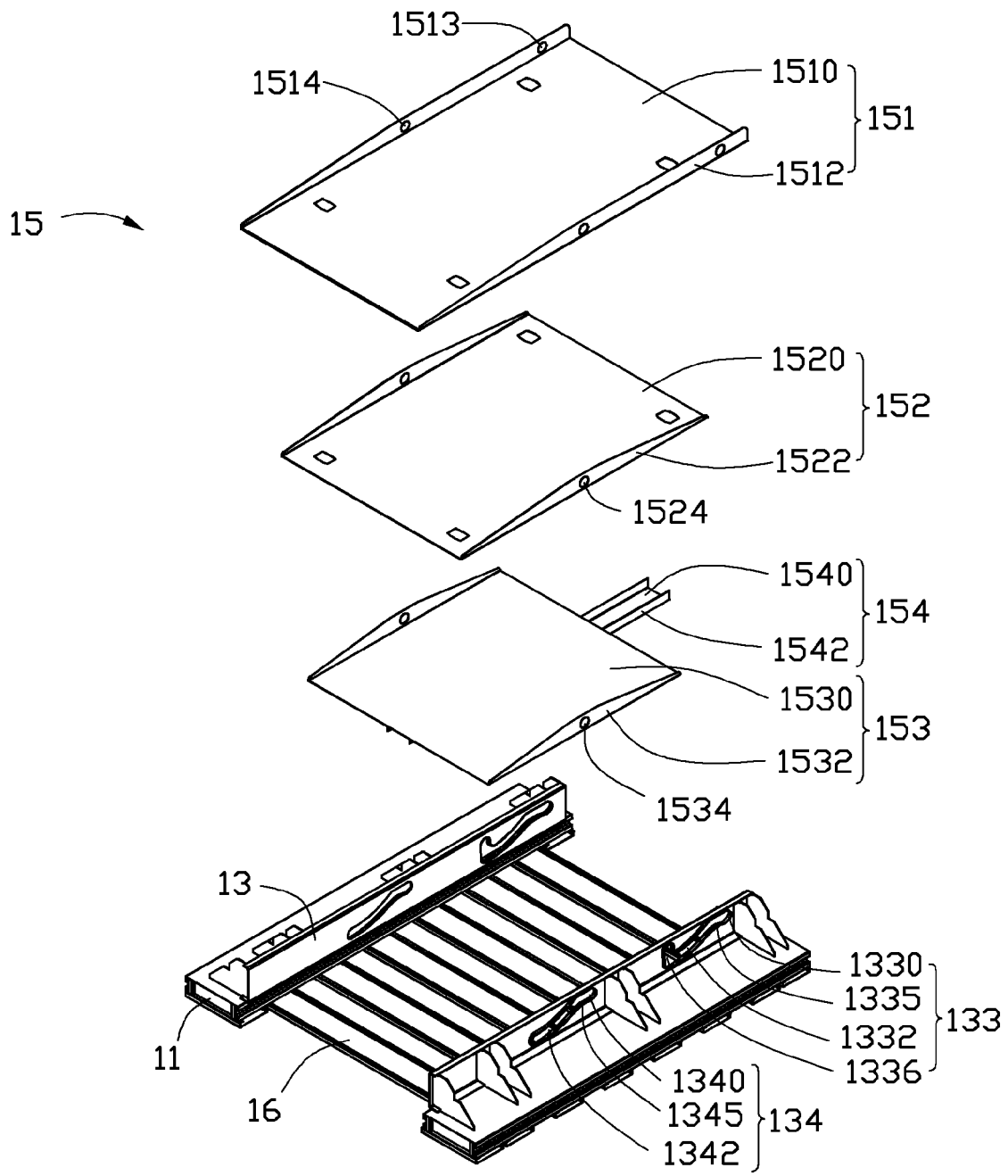
FIG. 3 is an exploded view of the stack board of FIG. 1.
Figure 4:
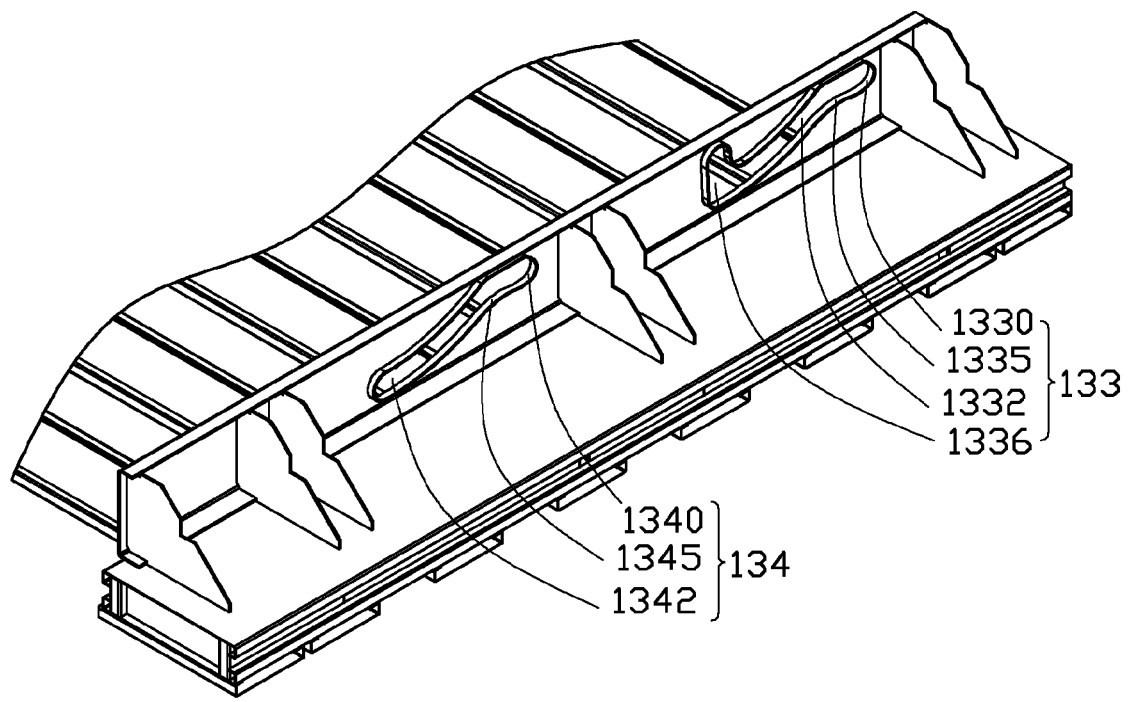
FIG. 4 is an enlarged view of part of the stack board of FIG. 3.
Figure 5:
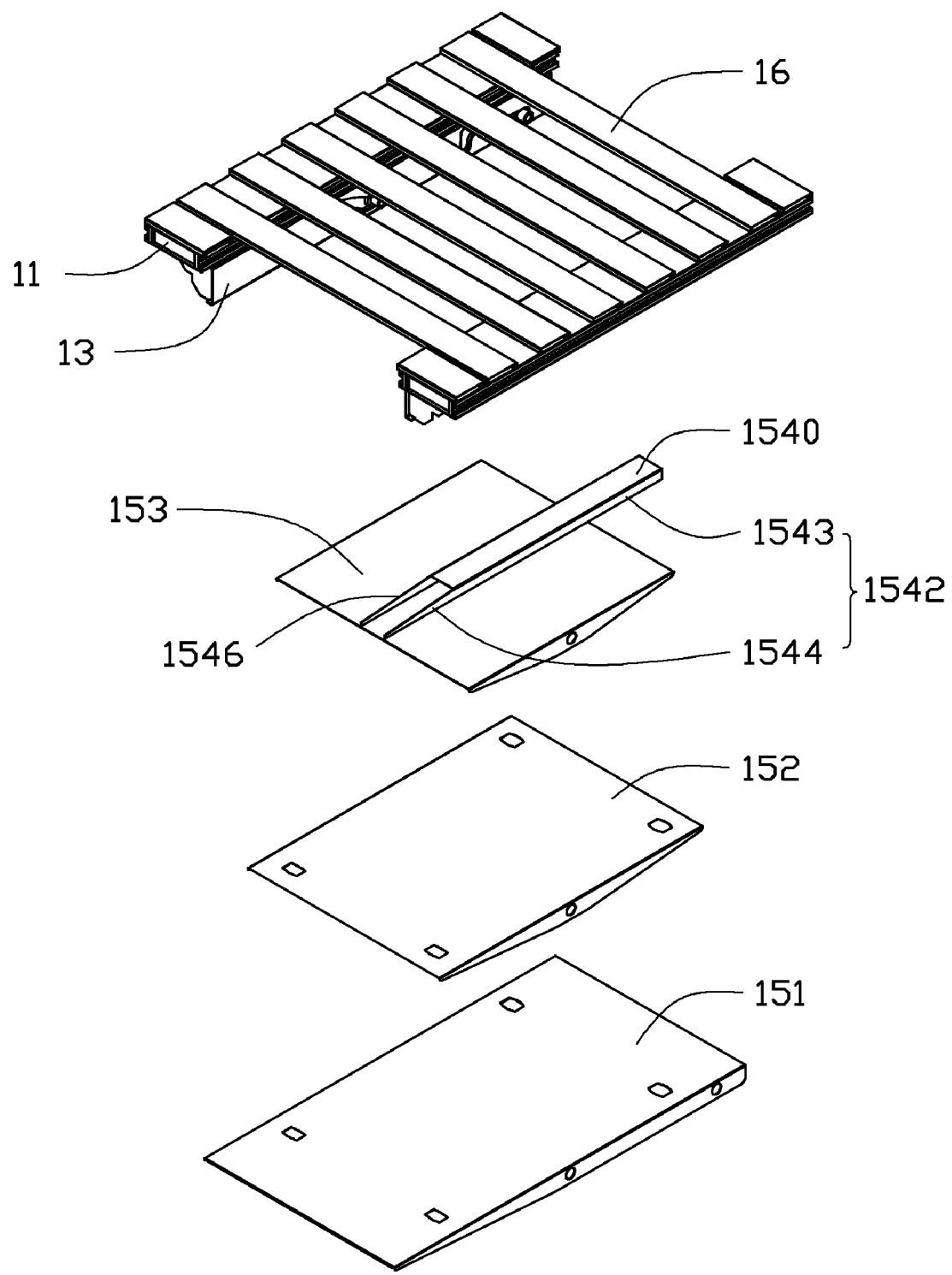
FIG. 5 is a similar to FIG. 3, but viewed from a different aspect.

The stack board 10 resembles a pallet in some respects, and includes a base 11 and a supporting platform 15 moveable relative to the base 11. Referring also to FIGS. 3-5, the base 11 includes an elongated first supporting block 112, an elongated second supporting block 113 parallel to and spaced from the first supporting block 112, a plurality of elongated feet 16 connected between the first and second supporting blocks 112, 113, and a guide mechanism 13 formed on the first and second supporting blocks 112, 113. Each of the first and second supporting blocks 112, 113 is hollow and rectangular, and defines a through hole (not labeled) along a longitudinal axis thereof for receiving forklift forks. The feet 16 are parallel to each other. Each of the feet 16 has one end connected to a bottom surface of the first supporting block 112, and another end connected to a bottom surface of the second supporting block 113.

The guide mechanism 13 includes two guide walls 130 and a plurality of reinforcing plates 132. The guide walls 130 extend up from top surfaces of the first and second supporting blocks 112, 113 respectively. The guide walls 130 are substantially the same length as the first and second supporting blocks 112, 113, respectively. Each of the reinforcing plates 132 extends perpendicular to the top surfaces of the first and second supporting blocks 112, 113 respectively, and is interconnected between an outer side of a corresponding guide wall 130 and the top surface of a corresponding supporting block 112, 113. The reinforcing plates 132 can increase the strength of the two guide walls 130. Each of the guide walls 130 defines a first guide channel 133 at a rear portion thereof and a second guide channel 134 at a center thereof.

Each of the first guide channels 133 includes a first locating hole 1330 at a top end of a corresponding guide wall 130, an elongated first oblique groove 1332 angling downward from the first locating hole 1330 to a bottom end of the corresponding guide wall 130, and a vertical groove 1336 extending up from a bottom end of the first oblique groove 1332. A bottom of the first locating hole 1330 is slightly lower than a top end of the first oblique groove 1332, thus forming a first bulge 1335 between the first locating hole 1330 and the first oblique groove 1332. A bottom end of the vertical groove 1336 of the first guide channel 133 communicates with the bottom end of the first oblique groove 1332, and a top end of the vertical groove 1336 of the first guide channel 133 is aligned with the first locating hole 1330. The first guide channels 133 of the two guide walls 130 are directly opposite each other.

Each of the second guide channels 134 includes a second locating hole 1340 at the top end of a corresponding guide wall 130, and an elongated second oblique groove 1342 angling downward from the second locating hole 1340 to the bottom end of the corresponding guide wall 130. A bottom of the second locating hole 1340 is slightly lower than a top end of the second oblique groove 1342, thus forming a second bulge 1345 between the second locating hole 1340 and the second oblique groove 1342. The first and second locating holes 1330, 1340 are aligned with each other. A diameter of the first and second locating holes 1330, 1340 is equal to a width of the first and second oblique grooves 1332, 1342. The second guide channels 134 of the two guide walls 130 are directly opposite each other. At each guide wall 130, axes defined by the first and second oblique grooves 1332, 1342 of the first and second guide channels 133, 134 are substantially parallel to each other.

The supporting platform 15 includes a first plate 151, a second plate 152, a third plate 153, and a brace 154. The first plate 151 includes a rectangular first main plate 1510, and two first flanges 1512 extending up from two opposite long sides of the first main plate 1510, respectively. A length of the first main plate 1510 is substantially equal to that of the guide walls 130, and a width of the first main plate 1510 is less than a distance between the two guide walls 130. A first connecting hole 1513 and a second connecting hole 1514 are defined in rear and middle portions of each of the first flanges 1512, respectively. A height of the first flanges 1512 is constant from the rear portion to the middle portion, and gradually decreases from the middle portion to a front portion. Diameters of the first and second connecting holes 1513, 1514 are equal to the diameters of the first and second locating holes 1330, 1340 of the first and second guide channels 133, 134, respectively.

The second plate 152 is located under the first plate 151. The second plate 152 includes a rectangular second main plate 1520, and two second flanges 1522 extending up from two opposite long sides of the second main plate 1520, respectively. A height of each of the second flanges 1522 gradually decreases from the center towards front and rear portions, respectively. The second main plate 1522 is shorter than the first main plate 1510, but wider than the first main plate 1510 and slightly narrower than the distance between the two guide walls 130. A third connecting hole 1524 is defined in the middle portion of each of the second flanges 1522. A diameter of the third connecting hole 1524 is equal to that of the second location hole 1340 of the corresponding second guide channel 134.

The third plate 153 has a similar structure to the second plate 152. The third plate 153 includes a rectangular third main plate 1530, and two third flanges 1532 extending up from two opposite long sides of the third main plate 1530, respectively. A height of each of the third flanges 1532 gradually decreases from the center towards front and rear portions thereof, respectively. A fourth connecting hole 1534 is defined in the middle portion of each of the third flanges 1532. A diameter of the fourth connecting hole 1534 is equal to that of the second location hole 1340 of the corresponding second guide channel 134. The third main plate 1530 is shorter than the second main plate 1520, but wider than the second main plate 1520. A width of the third main plate 1530 is substantially equal to the distance between the two guide walls 130.

The brace 154 includes an elongated strip 1540, and two connecting walls 1542 located at two opposite long sides of the elongated strip 1540, respectively. The brace 154 is located under the third plate 1530. The brace 154 is made of material having high intensity (strength), such as steel. The brace 154 reinforces the supporting platform 15, with the carrying capacity of the supporting platform 15 thereby greatly increased. The brace 154 is located at the center of a bottom surface of the third main plate 1530 and extends along a central longitudinal axis of the third main plate 1530. The brace 154 connects to the third main plate 153 by fixing the connecting walls 1542 to the bottom surface of the third main plate 153, with the elongated strip 1540 spaced from the bottom surface of the third main plate 153. The connecting walls 1542 are longer than the third main plate 1530. Each of the connecting walls 1542 includes a rectangular rear portion 1543 extending perpendicular to a corresponding long side of the elongated strip 1540, and a triangular front portion 1544 extending forward from a front end of the rear portion 1543. The rear portion 1543 of the connecting wall 1542 has a constant height along a longitudinal axis thereof, and the front portion 1544 of the connecting wall 1542 has a height gradually decreasing from the rear portion 1543.

When the stack board 10 is assembled, the first, second and third plates 151, 152, 153 are stacked to cooperatively form the supporting platform 15, with the second, third and fourth connecting holes 1514, 1524, 1534 aligning with each other. Top and bottom surfaces of the second main plate 1520 respectively contact a bottom surface of the first main plate 1510 and a top surface of the third main plate 1530. The second flanges 1522 respectively abut outer sides of the first flanges 1512, and the third flanges 1532 respectively abut outer sides of the second flanges 1522. The brace 154 connects to the bottom surface of the third main plate 1530. The front portions 1544 of the connecting walls 1542 are aligned with a front side of the third main plate 1530, and the rear portions 1543 of the connecting walls 1542 protrude from a rear side of the third main plate 1530. The supporting platform 15 is situated between the two guide walls 130 of the guide mechanism 13, with the second, third and fourth connecting holes 1514, 1524, 1534 aligned with the second locating holes 1340 of the guide walls 130, and the first connecting holes 1513 aligned with the first location holes 1330 of the guide walls 130.

Figure 6:
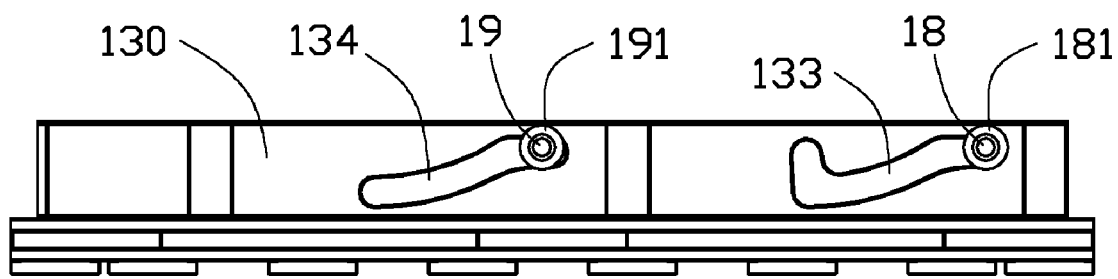
FIG. 6 is a side view of the stack board of FIG. 1.

Referring to FIG. 6, two first pivots 18 respectively extend through the first locating holes 1330 of the first guide channels 133 and the first connecting holes 1513 of the first plate 151 to interconnect the supporting platform 15 and the guide walls 130. Annular caps 181 are respectively coupled to two opposite ends of each of the first pivots 18. Each cap 181 has an outer diameter larger than the diameter of the first locating holes 1330 (the diameter of the first connecting holes 1513), thereby preventing the first pivots 18 from disengaging from the first guide channels 133 and the first connecting holes 1513. Similarly, two second pivots 19 respectively extend through the second location holes 1340 of the second guide channels 134, and the second, third and fourth connecting holes 1514, 1524, 1534 of the first, second and third plates 151, 152, 153, to interconnect the supporting platform 15 and the guide walls 130. Annular caps 191 are mounted around opposite ends of each of the second pivots 19 to prevent the second pivots 19 from disengaging from the second guide channels 134 and the second, third and fourth connecting holes 1514, 1524, 1534. The supporting platform 15 is moveable relative to the base 11 via the first and second pivots 18, 19, which are slideable in the first and second guide channels 133, 134, respectively.

Figure 7:
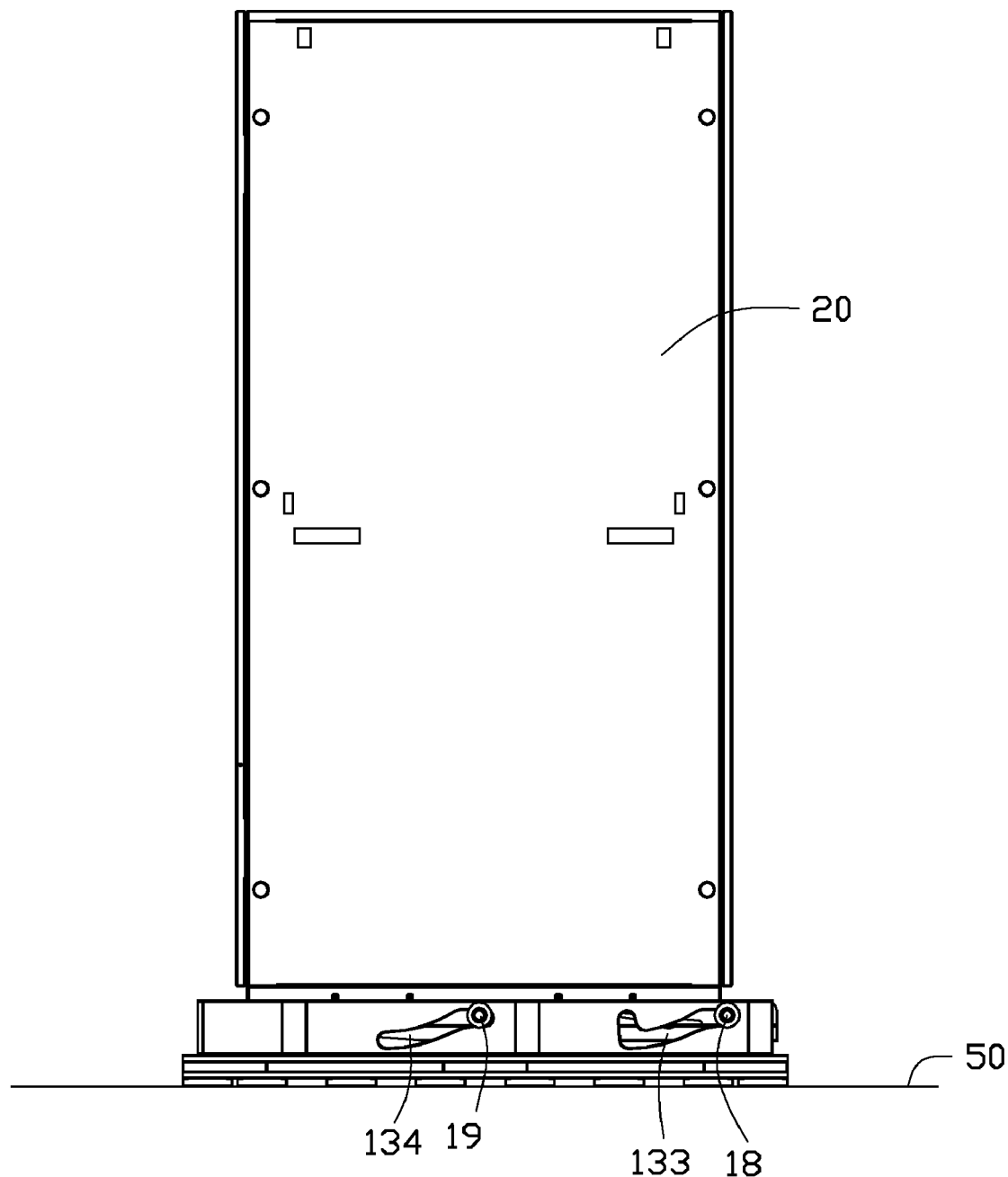
FIGS. 7-9 are side views schematically showing successive stages when the server system is moved from the stack board to the ground along a moveable supporting platform of the stack board.

When the server system 20 is mounted on the supporting platform 15 of the stack board 10, referring to FIG. 7, the first and second pivots 18, 19 are respectively received in the first and second locating holes 1330, 1340 of the first and second guide channels 133, 134. The first and second pivots 18, 19 are maintained in the first and second location holes 1330, 1340 by the first and second bulges 1335, 1345 of the first and second guide channels 133, 134, respectively. In this position, the supporting platform 15 is interconnected horizontally between the two guide walls 130 and substantially coincides with the base 11, with a distance between the supporting platform 15 and the base 11 substantially equal to a distance between the locating holes 1330, 1340 and the base 11. The server system 20 is fixed to the supporting platform 15 via a plurality of fasteners (not shown).

Figure 8:
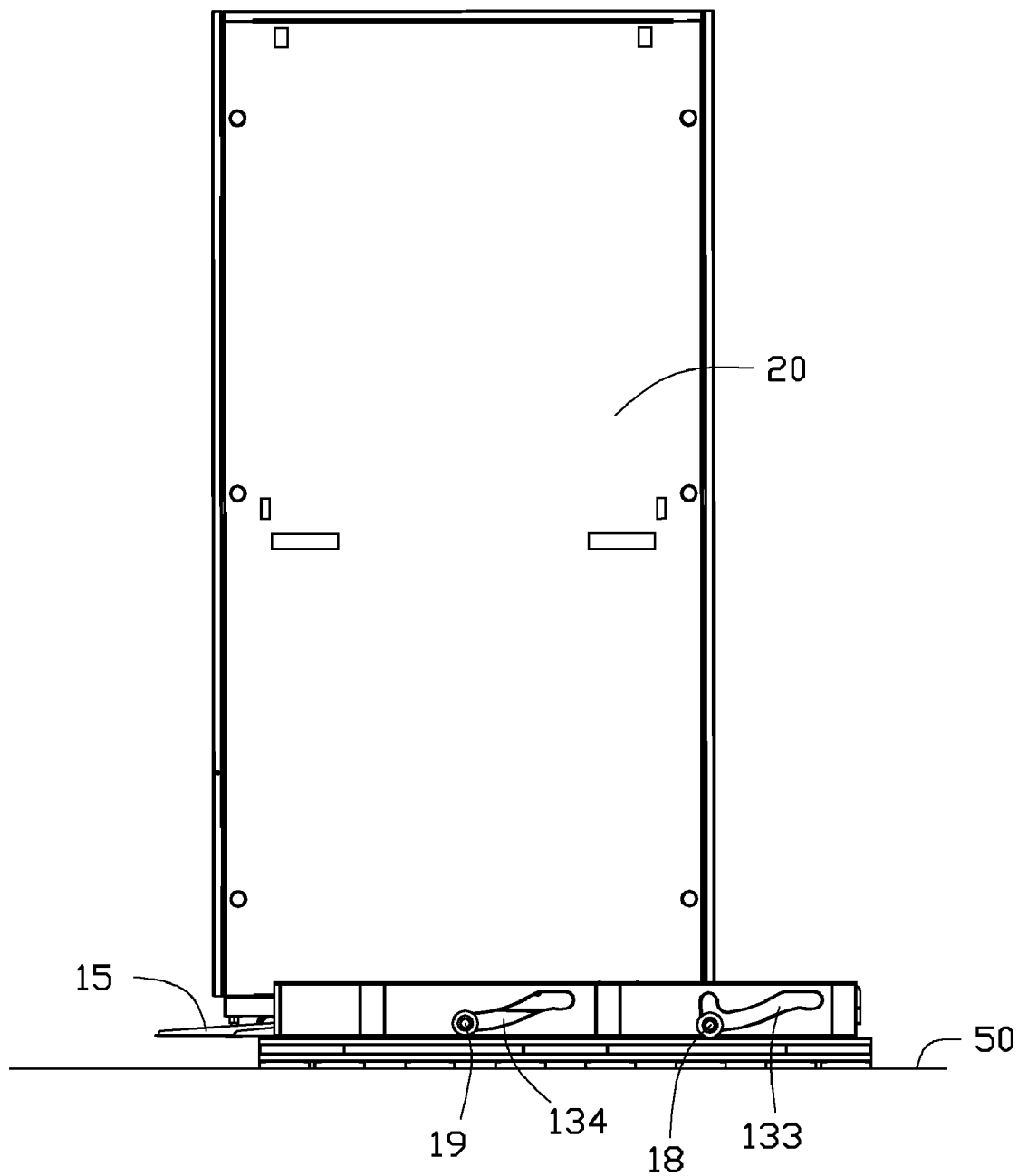

When the server system 20 is to be moved from the stack board 10 to another surface area such as the ground, the server system 20 is moved forward together with the supporting platform 15. The supporting platform 15 moves forward relative to the base 11. In this process, the first and second pivots 18, 19 ride over the first and second bulges 1335, 1345, respectively, move into the first and second oblique grooves 1332, 1342, and then sliding therealong. Referring to FIG. 8, when the first and second pivots 18, 19 reach the bottom ends of the first and second oblique grooves 1332, 1342, the supporting platform 15 protrudes from a front side of the base 11. In this position, the supporting platform 15 is interconnected horizontally between the two guide walls 130 and protrudes from one side of the base 11, with a distance between the supporting platform 15 and the base 11 substantially equal to that between the bottom ends of the first and second oblique grooves 133, 134 and the base 11.

Figure 9:
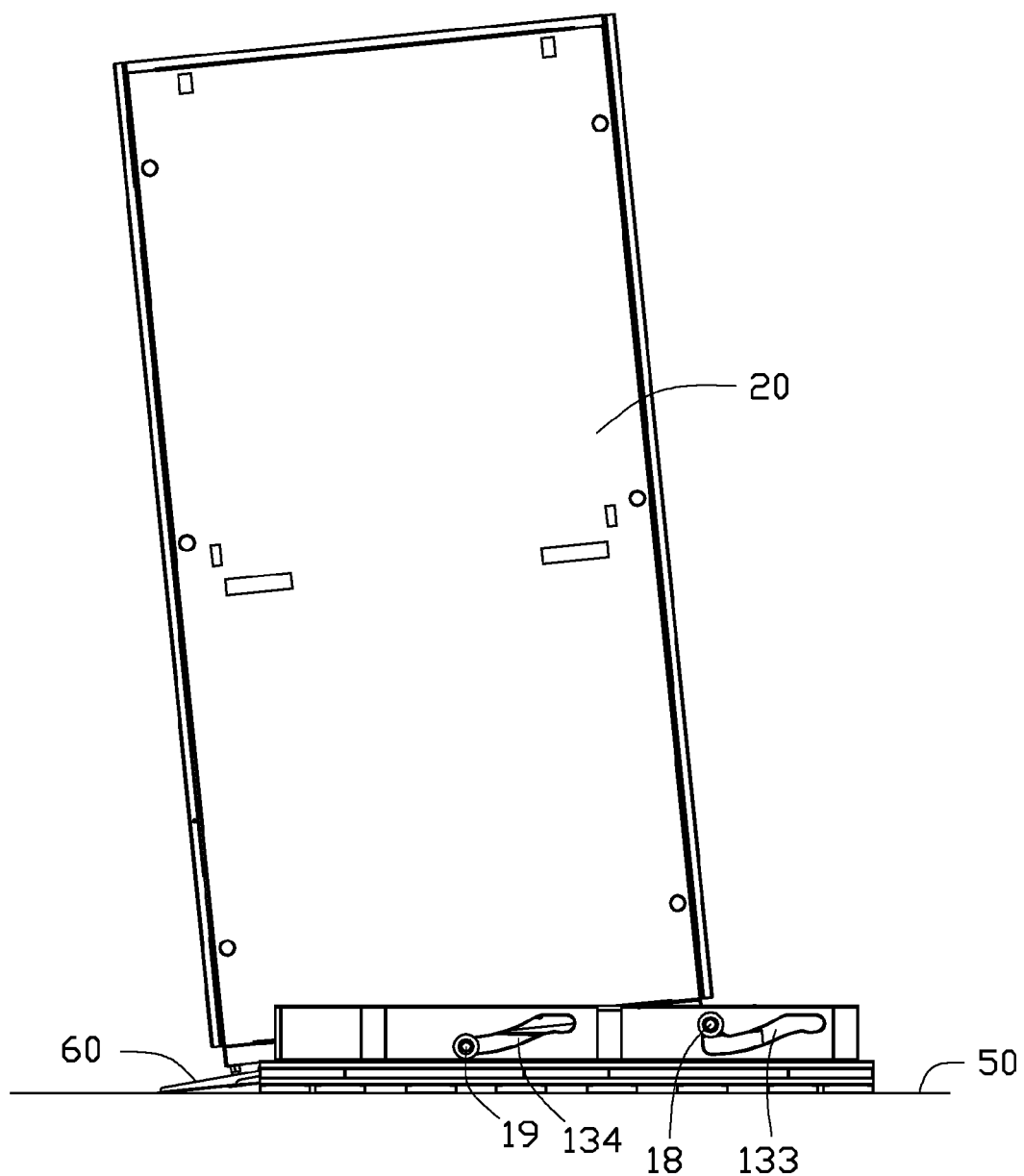

Downward force applied on a front end of the supporting platform 15 rotates the supporting platform 15 about the second pivots 19, and the first pivots 18 thereby move upward along the vertical grooves 1336 of the first guide channels 133 from the bottom ends of the first oblique grooves 1332. Referring to FIG. 9, when the first pivots 18 reach the top ends of the vertical grooves 1336, the supporting platform 15 forms a sliding track angled between the ground and the base 11, along which the wheels 26 at the bottom side of the server system 20 can move. Thus there is no need for a separate dedicated guiding ramp. The stack board 10 provides convenient transportation and lowers costs. The front portions 1544 of the connecting walls 1542 of the brace 154 can avoid interference between the supporting platform 15 and the base 11 when the supporting platform 15 rotates about the second pivots 19 to form the sliding track.

Finally, the fasteners connected between the server system 20 and the supporting platform 15 are removed, and the server system 20 is moved along the supporting platform 15 and then downward to the ground 50 along the supporting platform 15. After the server system 20 reaches the ground, the supporting platform 15 is moved backward to horizontally interconnect the two guide walls 130.

In this embodiment, the supporting platform 15 includes the first, second and third plates 151, 152, 153 stacked on each other, such that the supporting platform 15 can function as a leaf spring, supporting the server system 20 thereon and preventing damage thereto during shipping. Furthermore, multiple plates, that is, the first, second and third plates 151, 152, 153, included in the supporting platform 15 reinforce the supporting platform 15 to increase the carrying capacity thereof. The number of plates deployed can vary according to particular requirements.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A stack board comprising:
a base defining a plurality of guide channels therein;
a supporting platform mounted on the base and capable of supporting an object thereon; and
a plurality of pivots connected between the base and the supporting platform, the pivots received in the guide channels, respectively, and moveable along the guide channels such that the supporting platform is movable relative to the base from a first position substantially coinciding with the base to a second position protruding from one side of the base;
wherein the base comprises two guide walls parallel to and spaced from each other, the guide channels being defined in the guide walls;
wherein the guide channels defined in each guide wall comprise a first guide channel at one end of the guide wall and a second guide channel at a central portion of the guide wall, the first guide channel comprising a first locating hole at a top of the guide wall, a first groove extending downward from the first locating hole towards a bottom of the guide wall, and a vertical groove extending up from a bottom end of the first groove, the second guide channel comprising a second locating hole at the top of the guide wall, and a second groove extending downward from the second locating hole towards the bottom of the guide wall;
wherein in each guide wall, the first locating hole and the second locating hole are substantially located at a same height, and the first and second grooves are substantially parallel to each other and oblique with respect to a line defined by the first and the second locating holes; and
wherein a top end of the vertical groove is substantially located at the same height as the first and second locating holes.

2. The stack board of claim 1, wherein a first bulge is formed between the first locating hole and the first groove of each first guide channel, and a second bulge is formed between the second locating hole and the second groove of each second guide channel.

3. The stack board of claim 1, wherein the supporting platform comprises a first plate and a second plate stacked on each other, the first plate comprising a first main plate and two first flanges extending up from two opposite long sides of the first main plate, respectively, each of the first flanges defining a first connecting hole and a second connecting hole corresponding to the first locating hole and the second locating hole of each of the guide walls, respectively, the second plate comprising a second main plate and two second flanges extending up from two opposite long sides of the second main plate, respectively, each of the second flanges defining a third connecting hole corresponding to the second locating hole of each of the guide walls.

4. The stack board of claim 3, wherein the first main plate is longer than the second main plate but narrower than the second main plate, the first main plate is located above the second main plate, and the second flanges abut outer sides of the first flanges, respectively.

5. The stack board of claim 3, wherein the pivots connected between the base and the supporting platform comprise two first pivots respectively extending through the first locating holes of the first guide channels and the first connecting holes of the first plate when the supporting platform is in the first position, and two second pivots respectively extending through the second locating holes of the second guide channels and the second and third connecting holes of the first and second plates when the supporting platform is in the first position, with the supporting platform capable of rotating about the second pivots when the supporting platform is in the second position.

6. The stack board of claim 3, wherein the supporting platform further comprises a brace located at the center of the second plate and extending along a central longitudinal axis of the second plate.

7. The stack board of claim 1, wherein the base further comprises a plurality of reinforcing plates located at outer sides of the two guide walls, respectively, each of the reinforcing plates connected between the outer side of a corresponding guide wall and the base.

8. The stack board of claim 1, wherein a bottom end of the second groove is lower than the second locating hole.

9. The stack board of claim 8, wherein a bottom end of the vertical groove is substantially located at the same height as the bottom end of the second groove.

10. A server assembly comprising:
a server system comprising a rack adapted for accommodating a plurality of servers; and
a stack board comprising:
a base defining a plurality of guide channels therein; and
a supporting platform moveable relative to the base, the supporting platform capable of supporting the server system thereon, a plurality of pivots connected between the base and the supporting platform, the pivots received in the guide channels, respectively, and moveable along the guide channels such that the supporting platform is movable relative to the base from a first position substantially coinciding with the base to a second position protruding from one side of the base;
wherein the base comprises two elongated guide walls parallel to and spaced from each other, the guide channels defined in the guide walls;
wherein the guide channels defined in each of the guide walls comprise a first guide channel at one end of the guide wall and a second guide channel at the center of the guide wall, the first guide channel comprising a first locating hole at a top of the guide wall, a first groove extending downward from the first locating hole to a bottom of the guide wall and a vertical groove extending up from a bottom end of the first groove, the second guide channel comprising a second locating hole at the top of the guide wall and a second groove extending downward from the second locating hole towards the bottom of the guide wall;
wherein the supporting platform comprises a first plate and a second plate stacked on each other, the first plate comprising a first main plate and two first flanges extending up from two opposite long sides of the first main plate, respectively, each of the first flanges defining a first connecting hole and a second connecting hole corresponding to the first locating hole and the second locating hole of each of the guide walls, respectively, the second plate comprising a second main plate and two second flanges extending up from two opposite long sides of the second main plate, respectively, each of the second flanges defining a third connecting hole corresponding to the second locating hole of each of the guide walls; and
wherein the pivots connected between the base and the supporting platform comprise two first pivots respectively extending through the first guide channels of the guide walls and the first connecting holes of the first plate, and two second pivots respectively extending through the second guide channels of the guide walls and the second and third connecting holes of the first and second plates, the supporting platform capable of rotating about the second pivots when the supporting platform is in the second position.

11. The server assembly of claim 10, wherein in each guide wall, the first locating hole and the second locating hole are located at a same height, bottom ends of the first groove and the second groove are located at a same height and are lower than the first and second locating holes, and the first and second grooves are substantially parallel to each other.

12. A stack board comprising:
a base defining a plurality of guide channels therein;
a supporting platform moveable relative to the base, the supporting platform for supporting a server system thereon; and
a plurality of pivots connected between the base and the supporting platform, the pivots received and moveable along the guide channels such that the supporting platform is movable relative to the base from a first position substantially coinciding with the base to a second position protruding from one side of the base;
wherein the base comprises two elongated guide walls parallel to and spaced from each other, the guide channels defined in the guide walls;
wherein the guide channels defined in each of the guide walls comprise a first guide channel and a second guide channel, the first guide channel comprising a first locating hole at a top of the guide wall, a first groove extending downward from the first locating hole towards a bottom of the guide wall, and a vertical groove extending up from a bottom end of the first groove, the second guide channel comprising a second locating hole at the top of the guide wall, and a second groove extending downward from the second locating hole towards the bottom of the guide wall;
wherein the supporting platform comprises a first plate and a second plate stacked on each other, the first plate comprising a first main plate and two first flanges extending up from two opposite long sides of the first main plate, respectively, each of the first flanges defining a first connecting hole and a second connecting hole corresponding to the first locating hole and the second locating hole of each of the guide walls, respectively, the second plate comprising a second main plate and two second flanges extending up from two opposite long sides of the second main plate, respectively, each of the second flanges defining a third connecting hole corresponding to the second locating hole of each of the guide walls; and
wherein the pivots connected between the base and the supporting platform comprise two first pivots respectively extending through the first locating holes of the first guide channels and the first connecting holes of the first plate when the supporting platform is in the first position, and two second pivots respectively extending through the second locating holes of the second guide channels and the second and third connecting holes of the first and second plates when the supporting platform is in the first position, with the supporting platform capable of rotating about the second pivots when the supporting platform is in the second position.

* * * * *